(12) United States Patent
Ottens et al.

(10) Patent No.: US 6,897,945 B1
(45) Date of Patent: May 24, 2005

(54) LITHOGRAPHIC APPARATUS AND DEVICE MANUFACTURING METHOD

(75) Inventors: Joost Jeroen Ottens, Veldhoven (NL); Hendrik Anthony Johannes Neerhof, Eindhoven (NL); Koen Jacobus Johannes Maria Zaal, Eindhoven (NL); Marco Le Kluse, Maassluis (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/734,641

(22) Filed: Dec. 15, 2003

(51) Int. Cl.[7] .................. G03B 27/58; G03B 27/32; G03B 27/42; G03B 27/62
(52) U.S. Cl. .................. 355/72; 53/75; 53/77
(58) Field of Search .................. 355/53, 72, 75, 355/77; 361/324; 269/20

(56) References Cited

U.S. PATENT DOCUMENTS 5,923,408 A    7/1999  Takabayashi
6,496,350 B2 *  12/2002 Fujiwara .................. 361/234
6,628,503 B2 *   9/2003 Sogard .................... 361/324
2002/0067585 A1  6/2002 Fujiwara
2002/0159217 A1  10/2002 Tsuruta et al.
2004/0079518 A1 *  4/2004 del Puerto et al. ......... 165/58

FOREIGN PATENT DOCUMENTS

EP    1 241 706 A2    9/2002
EP    1 411 391 A2    4/2004

* cited by examiner

Primary Examiner—Alan Mathews
(74) Attorney, Agent, or Firm—Pillsbury Winthrop LLP (57) ABSTRACT

A lithographic apparatus includes an illumination system for providing a beam of radiation, an article support for supporting a flat article to be placed in a beam path of the beam of radiation on the article support, a backfill gas feed arranged in the article support for feeding backfill gas to a backside of the article when supported by the article support, and a clamp for clamping the article against the article support during projection. According to one aspect of the invention, the apparatus includes a controller for controlling the clamp and/or the backfill gas feed pressure so as to release the clamp prior to reducing the backfill gas feed pressure.

14 Claims, 5 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Brief Description of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In the conventional lithographic projection apparatus, during photolithographic processes, an article, such as a wafer or reticle is clamped on an article support by a clamping force, that may range from vacuum pressure forces, electrostatic forces, intermolecular binding forces or just gravity force. The article support defines a plane, in the form of a plurality of protrusions defining an even flat surface on which the wafer or reticle is held. Tiny variations in the height of these protrusions are detrimental to image resolution, since a small deflection of the article from an ideal plane orientation may result in rotation of the wafer and a resulting overlay error due to this rotation. In addition, such height variations of the article support may result in height variation of the article that is supported thereby. During the lithographic process, such height variations may affect image resolution due to a limited focal distance of the projection system. Therefore, the article support may be flat.

European patent application EP0947884 describes a lithographic apparatus having a substrate holder wherein protrusions are arranged to improve the flatness of the substrate. These protrusions have a general diameter of 0.5 mm and are located generally at a distance of 3 mm away from each other and thereby form a bed of supporting members that support the substrate. Due to the relative large spaces in between the protrusions, contaminations possibly present generally do not form an obstruction for the flatness of the substrate, since these will be lying in between the protrusions and will not lift the substrate locally.

In the context of this application, the "article" may be any of the above mentioned terms wafer, reticle, mask, or substrate, more specifically terms such as: a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

The above mentioned protrusion configuration defines one single plane of support that is perfectly level and orientable into suitable directions. Even with a plurality of protrusions providing a reduced contact surface, there remains a relatively large contact surface of the protrusions physically in contact with the substrate. This may introduce a binding force, in the art known as "sticking", between the top faces of the protrusions of the substrate holder and the backside of substrate. Especially in vacuum operating conditions, such sticking may be considerable. In practice, this means that once a substrate is clamped to the substrate holder and brought into position for a photolithographic irradiation process, releasing the substrate from the substrate holder can take a substantial amount of time causing costly delay in the availability of the machine for a next photolithographic routine. It even may cause jamming of the ejection mechanisms present to release the substrate from the substrate holder. One aspect of the invention is aimed at minimizing these problems by providing a substrate holder where these sticking forces are not problematic.

SUMMARY

One aspect of the invention provides a lithographic projection apparatus according to the features of claim 1. In particular, in a lithographic apparatus, wherein the apparatus comprises a controller structured to control the clamp and/or the backfill gas feed pressure for releasing the article from the article support, the article may be unloaded by use of the backfill gas pressure, so that sticking forces between the article and the article support are reduced or cancelled altogether. Hence, by use of the backfill gas pressure, the sticking forces between the substrate and the substrate holder can be compensated to a desired extent or even be neutralized. Thus, when the clamp is switched off so that the substrate is no longer clamped to the substrate holder, due to a force provided by the backfill gas pressure, the binding forces between the substrate and substrate holder are reduced or cancelled.

It is noted that, contrary to conventional opinion, the inventors have found, that the release of backfill gas in the ambient vacuum is not problematic. Indeed, for a backfill gas pressure of 10 mbar, a maximum leakrate is obtained that is well below 0.15 mbar*1/s. Such leakrate is found acceptable for operating in vacuum conditions. It is noted that the backfill gas may contain other gasses, such as the inert gasses or other gasses suitable.

Preferably, the controller releases the clamp prior to reducing the backfill gas feed pressure. In this way, the still present gas pressure provides a positive lift to release the article from the article support. In contrast, conventionally, the backfill gas that is present will be evacuated prior to releasing the clamp.

In a preferred embodiment, the apparatus further comprises a presence detector for detecting a presence of the article on the article support, wherein the gas feed pressure controller controls the backfill gas feed pressure relative to a measured presence detection. Thus, when a presence detector detects the presence of the article, the gas pressure may be turned on or kept at a certain predetermined level, whereas, when the presence detector detects that the article is not (no longer) present, the gas feed pressure may be turned off in order to prevent outflow of gas in the environment, which may be a vacuum environment.

In a further preferred embodiment, the apparatus further comprises an article handler for handling the article during placement or removal of the article, the article handler arranged to provide a releasing force for releasing the article to be handled from the article support, wherein the backfill gas feed pressure controller controls the backfill gas feed pressure relative to a measured displacement or releasing force of the article handler. To this end, the article handler may serve as a presence detector as explained above, in that the measured displacement or releasing force is an indication of the presence of the article. Alternatively, for an electrostatic clamp, the presence detector may be formed by a capacity detector coupled to the electrostatic clamp.

Preferably, the gas fill pressure ranges from 1–15 mbar. Another aspect of the invention relates to a device manufacturing method as outlined in claim 10. In particular, the method comprises providing a substrate; providing a beam of radiation; using a patterning device to impart a cross-section of the beam of radiation with a pattern; providing an article support to support at least one of the substrate and the patterning device; projecting the patterned beam of radiation onto a target portion of the substrate; supplying backfill gas to the article support at a pressure; and unloading at least one of the substrate and the patterning device from the article support by using the pressure of the backfill gas.

By the inventive method, sticking may of the article against the article support may be cancelled or reduced by using the presence of the backfill gas pressure. In particular, preferably, the method comprises providing a clamping force for clamping the substrate and/or patterning device on the article support during projection of the patterned beam; providing a backfill gas pressure prior to projection for providing an improved thermal conduction between the article and the article support; and releasing the clamping force after projection so as to unload the substrate and/or patterning device from the article support by use of the backfill gas pressure. Preferably, the method comprises pressing the article by an article handler after providing the backfill gas pressure and prior to releasing the clamping force; and lifting the article by the article handler after releasing the clamping force. In this way, the article is kept in continuous contact with the article handler during release and there is no risk that the article is literally blown off the article holder.

Another aspect of the invention relates to a method for manufacturing a device as outlined in claim 10. In particular, the method comprises providing a substrate; providing a beam of radiation; using a patterning device to impart a cross-section of the beam of radiation with a pattern; providing an article support to support at least one of the substrate and the patterning device; projecting the patterned beam of radiation onto a target portion of the substrate; supplying backfill gas to the article support at a pressure; and unloading at least one of the substrate and the patterning device from the article support by using the pressure of the backfill gas.

Another aspect of the invention relates to a lithographic apparatus as outlined in claim 13. In particular, the apparatus comprises means for providing a beam of radiation; means for supporting a flat article to be placed in a beam path of the beam of radiation; means for supplying a backfill gas to a backside of the article at a backfill gas pressure when the article is supported by the means for supporting; means for clamping the article against the means for supporting during projection; and means for controlling at least one of the means for clamping and the means for supplying a backfill gas to release the article from the means for supporting by use of the backfill gas pressure.

Another aspect of the invention relates to a method for manufacturing a device as outlined in claim 14. In particular, the method comprises supplying a backfill gas to a backside of the article at a backfill gas pressure when the article is supported by an article support structure; clamping the article against the article support structure during projection of an image onto said article; and controlling at least one of said supplying and said clamping to release said article by use of said backfill gas pressure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (LV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF ILLUSTRATED EMBODIMENTS

Figure 1:
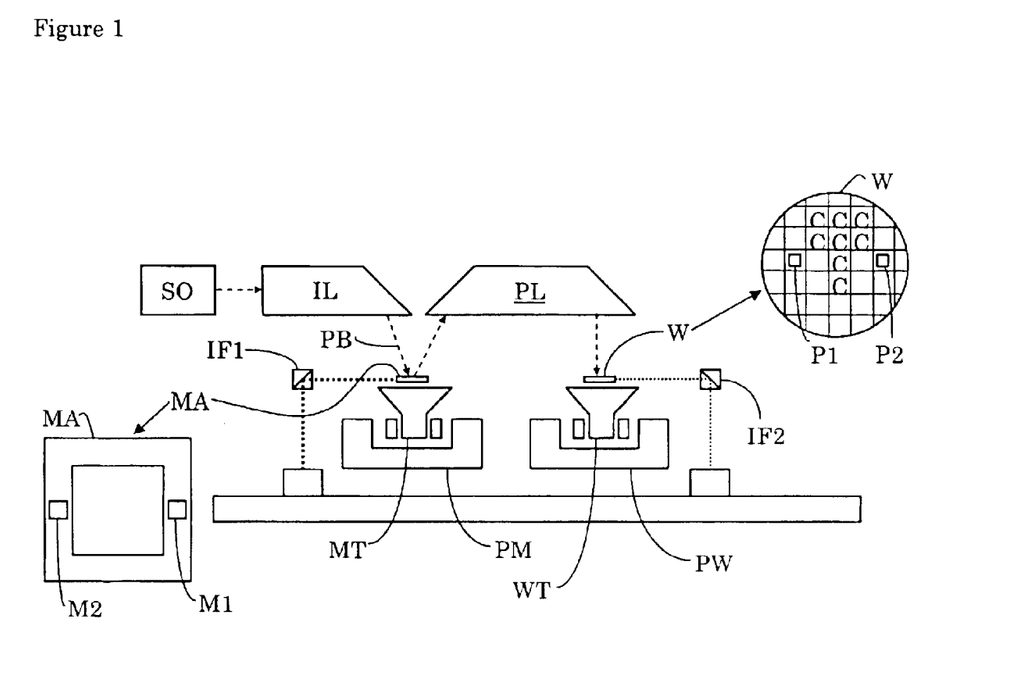
FIG. 1 depicts a lithographic apparatus according to an embodiment of the invention.

FIG. 1 schematically depicts a lithographic apparatus according to an embodiment of the invention. The apparatus comprises: an illumination system (illuminator) IL for providing a projection beam PB of radiation (e.g. UV or EUV radiation); a first article support or article support structure (e.g. a mask table) MT for supporting patterning device (e.g. a mask) MA and connected to first positioning structure PM for accurately positioning the patterning device with respect to item PL; a second article support (e.g. a wafer table) WT for holding a substrate (e.g. a resist-coated wafer) W and connected to second positioning structure PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be an integral part of the apparatus, for example when the source is a mercury lamp. The source SO and the illuminator IL, may be referred to as a radiation system.

The illuminator IL may comprise an adjustor that adjusts the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of the second positioning structure PW and position sensor IF2 (e.g. an interferometric device), the substrate table WT can be moved accurately, e.g. so as to position different target portions C in the path of the beam PB. Similarly, the first positioning structure PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning structure PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes.

In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the de magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device may be updated after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
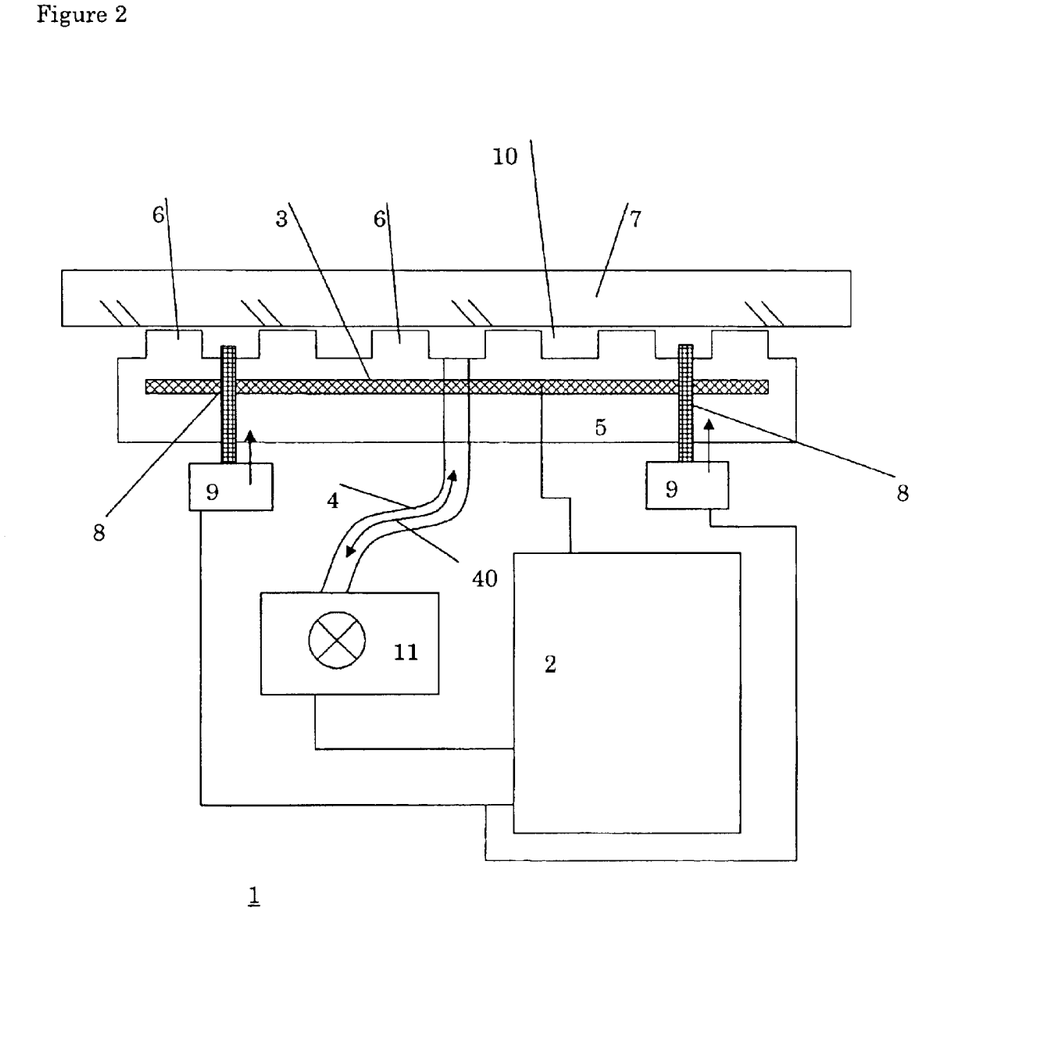
FIG. 2 shows a schematic embodiment of the lithographic apparatus comprising a controlling arrangement according to an embodiment of the invention.

FIG. 2 illustrates schematically the controlling arrangement 1 according to an embodiment of the invention, where a controller 2 is present for controlling an electrostatic clamp 3 and/or a backfill gas feed 4. The controller 2 may be a software part that is embodied in the controlling logic of the lithographic apparatus; it may be a separate controlling function or embodied in a general controlling program for controlling the process functions of the lithographic apparatus. Otherwise, it may be embodied in hardware, such a digital and/or analog circuit that is arranged to provide the controlling functions via circuitry that will not be elaborated upon since the design thereof may be implemented without burden when reading the disclosure of this application. As is illustrated with reference to FIG. 1, the clamp 3 may form part of an article support 5, which is illustrated to have a plurality of protrusions 6 such as is described with reference to European Patent No. EP0947884, published Oct. 6, 1999, which is incorporated herein by reference thereto. The protrusions 6 provide an ultra flat plane of support, so that during the photolithographic process, an article 7 is kept level in the most optimal way. To keep the article 7 stable to the article support 5, the clamp 3 provides a clamping force, that is, the article 7 is pressed onto the article support 5, for instance, by electrostatic clamping or other clamping methods known in the art. To this end, it will be clear, that one aspect of the invention equally applies to a general flat article to be placed in a projection beam, such as an optical element such as a (reflective or transmissive) reticle, or to a substrate to be irradiated, such as a wafer.

Furthermore to remove the article 7 from the article support 5, article handler pins 8 (in the art known as e-pins or ejection pins) are present, in the shown embodiment of FIG. 2, two of them are illustrated with corresponding actuators 9. After ending the photolithographic illumination process, the pins 8 are moved upward so as to contact the article 7, thereby lifting it from the protrusions 6 of the article support 5. Then, an article handler (not shown) may contact the article 7 and transport it away from the article support 5.

Conventionally, a substantial force is exerted upon the article 7 to unload the article 7 from the article support 5. Even so, sometimes, the article 7 may be bonded to the article support 5 to such an extent, that the ejection pins 8 lack sufficient strength to unload the article 7. This results in so-called down-time, when the photolithographic process is interrupted, and the apparatus has to be accessed by maintenance to remove the article 7 from the article support 5. Such bonding is referred to as "sticking".

According to one aspect of the invention, by use of the backfill gas pressure, the sticking forces between the article 7 and the article support 5 can be compensated to a desired extent or even be neutralized. To this end, according to one aspect of the invention, when the clamp is switched off so that the article 7 is no longer clamped onto the article support 5, due to a force provided by the backfill gas pressure, the binding forces between the article 7 and article support 5 are reduced or cancelled.

During the photolithographic process, a backfill gas 40 is supplied to a cavity 10 between the article 7 and the article support 5 to enhance thermal contact of the article 7 and the article support 5. Such is beneficial to illumination performance, since overheating of the article 7 is prevented which could result in thermal deformation or even loss. Conventionally, after the photolithographic process, the backfill gas 40 is pumped away by a backfill gas pump 11. This pump 11 may comprise a separate unit (not shown) for feeding the gas into the cavity 10 and a separate unit (not shown) for extracting the gas from the cavity 10.

According to one aspect of the invention, the controller 2 controls the clamp 3 and/or the backfill gas pump 11 pressure so as to release the clamp 3 prior to reducing the backfill gas feed pressure. Thus, the full pressure of the backfill gas 40 is used to counter the sticking force. For a typical pressure of 10 mbar, such counter force would, for a 300 mm wafer, result in a counter force of 70 N, which is typically enough to release the wafer from the article support 5. For a conventional reticle, such a force would be in the order of 22 N.

In FIG. 2, the controller 2 may comprise a presence detector (not shown) for detecting a presence of the article 7 on the article support 5 through measurement of the capacity formed by the electrostatic clamp 3 and the article 7 that is clamped thereby. A variation of the capacity may then be indicative for the presence of the article 7. Otherwise, the presence detector may be formed by a sensor that measures a displacement of the pins 8 and/or a releasing force that is exerted by the pins 8. Alternatively, the presence detection may be done by a separate detector, for instance through an optical detection. The presence detection is used in controlling the backfill gas feed pump 11. In a first position, where the article 7 is clamped on the article support 5, the indicated presence of the article 7 may result in a continued or even increased pressure of the backfill gas generated by the feed pump 11 for releasing the article 7 from the article support 5 by use of the backfill gas feed pressure. When the presence of the article 7 is no longer detected, the backfill gas feed pump 11 is controlled to stop feeding backfill gas 40.

There may be single gas feeds present for supplying a backfill gas that may differ from the gas normally used for thermal conduction, or these gas feeds may be present in addition to conventional gas feeds for supplying backfill gas for thermal isolation. In this aspect, the backfill gas may be used only to provide a lift, for instance, in an embodiment, wherein the clamping is performed by vacuum clamping. In such an embodiment, the clamp 3 is not present and the clamp is formed by pump 11 in suction mode. During release of the article 7 however, the controller 2 may control the pump 11 to provide a positive pressure by direction of the gas flow. In such a condition, backfill gas 40 is fed towards the backside of the article 7 for releasing the article 7 from the article support 5 by use of the backfill gas feed pressure.

Figure 3:
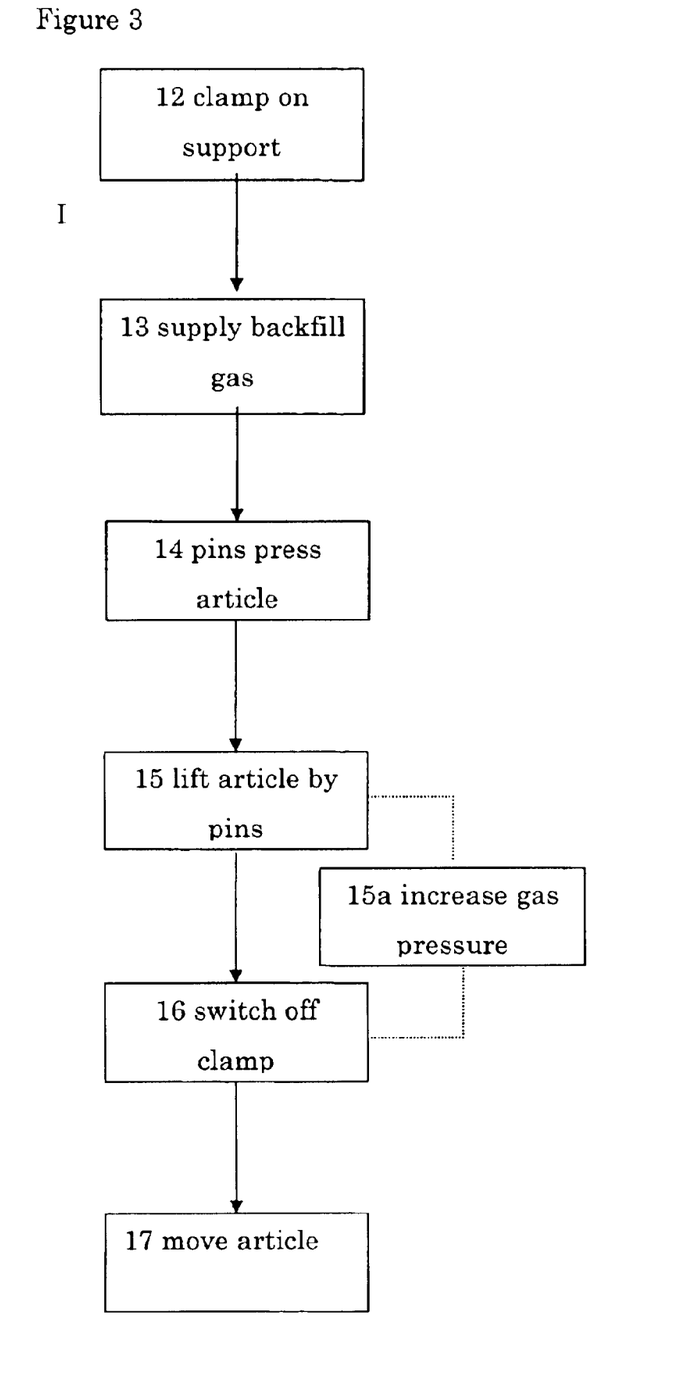
FIG. 3 schematically illustrates the steps for manufacturing a device according to the method of an embodiment of the invention.

FIG. 3 shows a schematic diagram illustrating the inventive steps of the method according to an embodiment of the invention. That is, in a method, where a device is manufactured using a photolithographic process, following a first sequence I, in a first step 12, an article, such as a wafer or (reflective) reticle is clamped onto an article support 5, for undergoing a photolithographic irradiation step. Then, in a second step 13, a backfill gas is supplied to the backside of the article 7. In case the backfill gas is supplied for thermal conduction reasons, this step is conducted prior to the irradiation step. After the first step 12 has been conducted, the clamping force clamps the article 7 to the article support 5. Therefore supplying the backfill gas in the second step 13 does not result in removal of the article from the article support 5. For unloading the article 7, however, in the third step 14, the controller 2 controls the pins 8 to press the article 7. Then in the fourth step 15, the controller 2 controls the pins 8 to lift the article 7 from the support 5. Almost simultaneously to step 15, in the fifth step 16, the controller 2 controls the clamp 3 to switch off the clamping force. Then, the pressure of the backfill gas is unbalanced, and therefore, an upward force is exerted on the article 7.

Almost simultaneously to step 15, in the sixth step 17 the pins 8 are physically moving the article 7 in a continuous pressing contact.

Alternatively, in step 15a, the backfill gas pressure may be increased, to further assist the pressure exerted by the pins 8.

Figure 4:
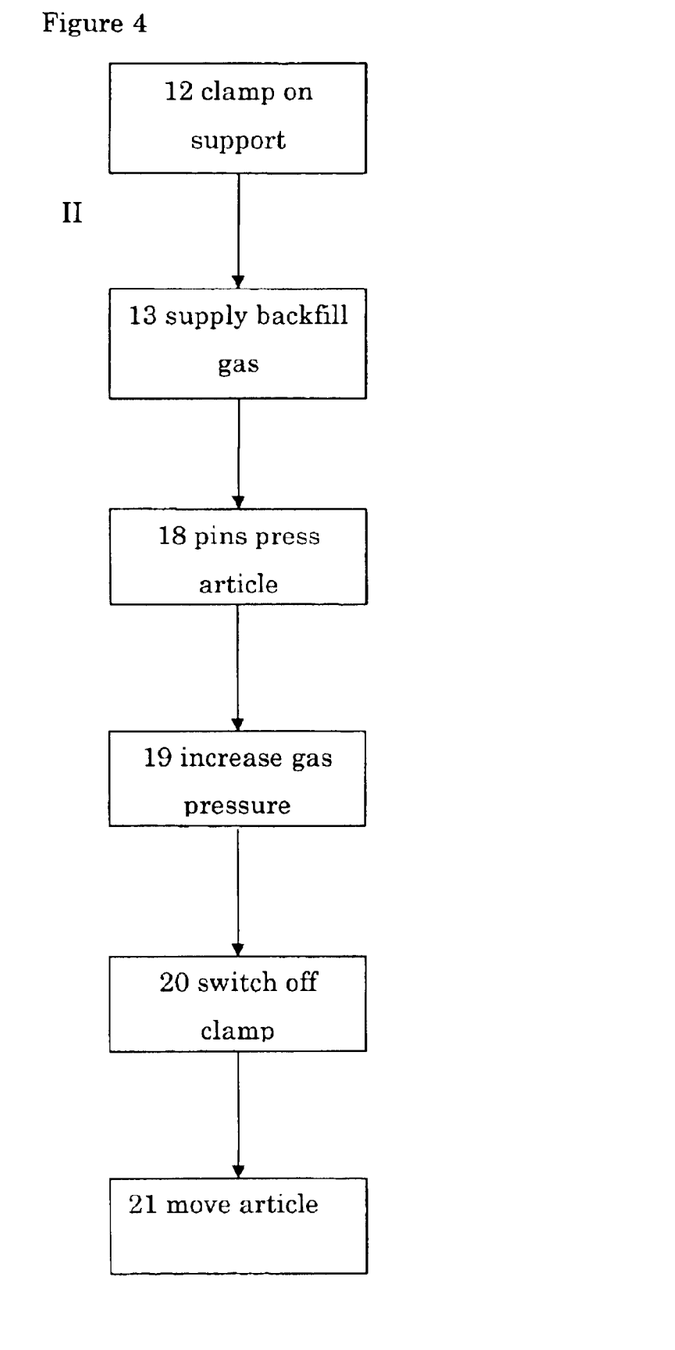
FIG. 4 schematically illustrates the steps for manufacturing a device according to the method of another embodiment of the invention.

Following a further alternative sequence II, illustrated in FIG. 4, similar to step 14, the pins 8 start pressing the article 7 in step 18. In a further step 19 the backfill gas pressure is increased to lift the article 7 from the support 5. Almost simultaneously to step 19, in step 20, the controller 2 controls the clamp 3 to switch off the clamping force. Then, the force exerted on the article 7 is unbalanced, so that the article is moved upward. Almost simultaneously to step 19, in step 21 the pins 8 are physically moving the article 7 in a continuous pressing contact.

Figure 5:
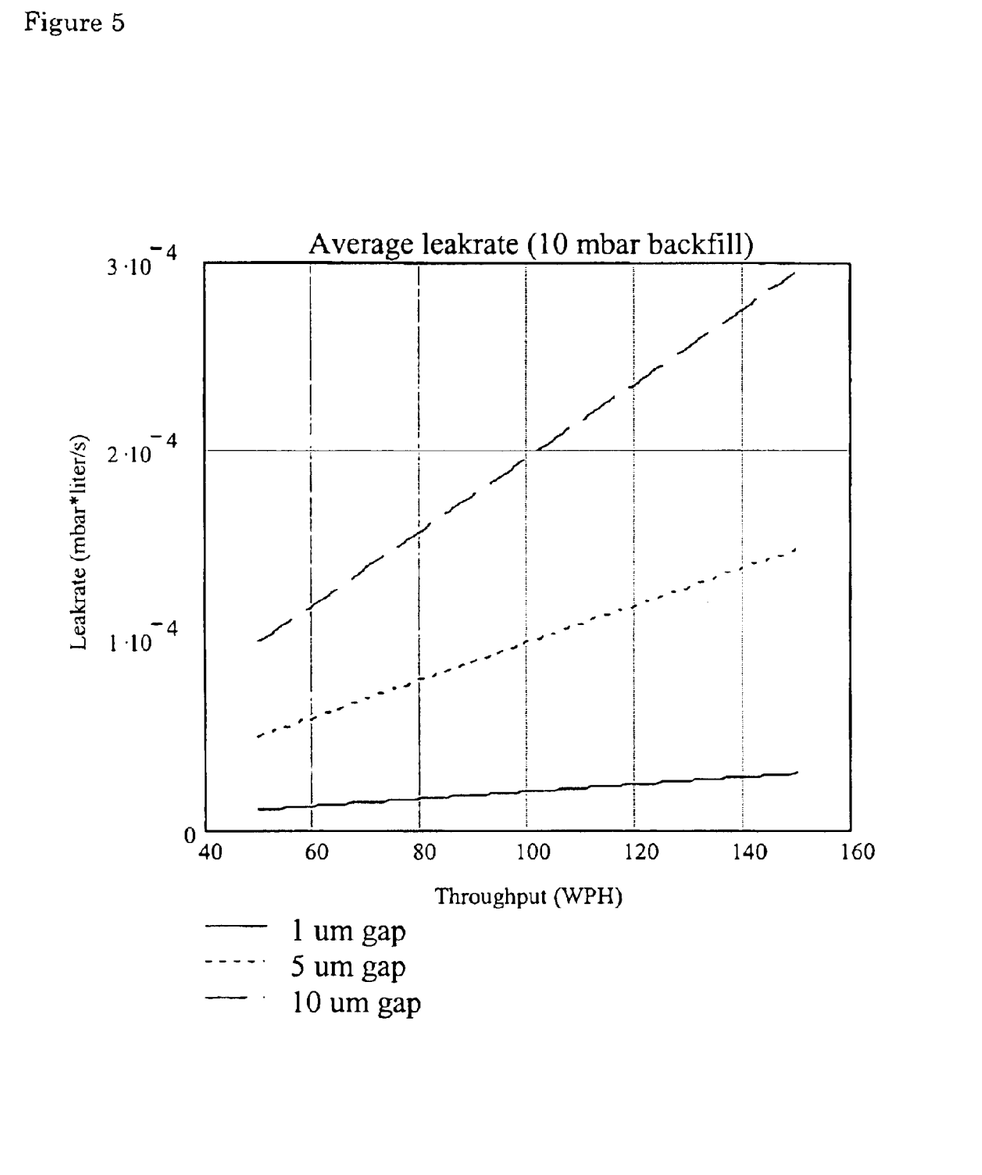
FIG. 5 shows a calculated leakrate load for an article support for clamping a 300 mm wafer.

FIG. 5 shows a graph representing a calculated leakrate load versus the number of wafers processed per hour (WPH) for an article support for clamping a 300 mm wafer. In the graph, the estimated leakrate is shown for a variety of backfill gas gaps ranging from 1 mu to 10 mu. It is shown that the leakrate is well below 0.15 mbar*1/s that defines the maximum tolerable leakrate for inert gasses in an electrostatically clamped vacuum system. In this context, the term vacuum pressure is relative to particular gasses that are present in the environment. For instance, for carbonhydrogens and water, the allowable background pressure is very low, in the order of 1e-9-1e-12 millibar. For inert gasses the requirements are less strict, for instance, for Ar an allowable background pressure ranges from 1e-4 mbar-1e-2 mbar, in particular, a pressure of 1e-3 mbar. Also, the relative background pressure may vary in terms of the environment of the apparatus. For instance, where the article support functions in the environment of a wafer support, the vacuum requirements for certain components may be less strict than in the environment where the article support functions as a reticle support. That is, the partial pressures for contaminants (such as CxHy and H20) may differ a factor 100 between optics compartment (including reticle support) and wafer compartment and are much lower than the total pressure (typical numbers are 1e-9 to 1e-12 mbar). It is shown that the leakrates vary with the gap height to a maximum of 3.10–4 mbar*1/s for a throughput as high as 150 wafers per hour. Hence it is demonstrated that in the operating environment, releasing the article from the article support by use of the backfill gas feed pressure is not problematic for the backfill gas load to the vacuum operating environment.

According to one aspect of the invention, the upward force provided by the present backfill gas may be beneficially used to lift the article from the article support.

While specific embodiments of the invention have been described above, it will be appreciated that the aspects of the invention may be practiced otherwise than as described. The description is not intended to limit the aspects of the invention.

What is claimed is:

1. A lithographic apparatus comprising:
    an illumination system constructed to provide a beam of radiation;
    an article support structure constructed to support an article to be placed in a beam path of said beam of radiation on said article support structure;
    a backfill gas feed arranged in said article support structure to feed backfill gas to a backside of said article at a backfill gas pressure when said article is supported by said article support structure;
    an electrostatic clamp structured to clamp said article against said article support structure during projection; and
    a controller structured to control at least one of said clamp and said backfill gas pressure to release said article from said article support structure by use of said backfill gas pressure.

2. A lithographic apparatus according to claim 1, wherein said at least one of said clamp and said backfill gas pressure is both said clamp and said backfill gas pressure, and said controller releases said clamp prior to reducing said backfill gas feed pressure.

3. A lithographic projection apparatus according to claim 1, further comprising:
    a presence detector structured to detect a presence of said article on said article support structure, and said controller controls said backfill gas feed pressure relative to a presence detection measured by said presence detector.

4. A lithographic projection apparatus according to claim 3, wherein said presence detector includes an electrostatic clamp capacity detector that is coupled to said clamp.

5. A lithographic projection apparatus according to claim 1, further comprising:
    an article handler structured to handle said article during placement or removal of said article with respect to said article support structure, said article handler constructed to provide a releasing force to release said article handled from said article support structure,
    said controller structured to control said backfill gas pressure relative to at least one of a measured displacement of said article measured by a displacement sensor and a releasing force of said article handler measured by a force sensor.

6. A lithographic projection apparatus according to claim 1, wherein said backfill gas pressure is in a range of 1–15 mbar.

7. A lithographic projection apparatus according to claim 1, wherein said electrostatic clamp defines a backfill gas gap that is below 15 mu.

8. A lithographic apparatus according to claim 1, wherein said article support structure is structured to support a patterning device, said patterning device serving to impart a cross-section of said beam of radiation with a pattern.

9. A lithographic apparatus according to claim 1, wherein said article support structure is a substrate table for holding a substrate to be patterned by a patterned beam onto a target portion of said substrate.

10. A method of manufacturing a device, comprising:

providing a substrate;

providing a beam of radiation;

using a patterning device to impart a cross-section of the beam of radiation with a pattern;

providing an article support to support at least one of the substrate and the patterning device;

projecting the patterned beam of radiation onto a target portion of the substrate;

supplying backfill gas to the article support at a pressure; and unloading at least one of the substrate and the patterning device from the article support by using the pressure of the backfill gas.

11. A method according to claim 10, further comprising:

providing a clamping force for clamping at least one of the substrate and patterning device during projection of the patterned beam;

providing the pressure of the backfill gas prior to projection for providing an improved thermal conduction between the article and the article support; and releasing the clamping force after projection to unload at least one of the substrate and the patterning device from the article support by use of the pressure of the backfill gas.

12. A method according to claim 11, further comprising:

pressing the article by an article handler after providing the backfill gas pressure and prior to releasing the clamping force; and lifting the article by the article handler after releasing the clamping force.

13. A lithographic apparatus comprising:

means for providing a beam of radiation;

means for supporting an article to be placed in a beam path of said beam of radiation;

means for supplying a backfill gas to a backside of said article at a backfill gas pressure when said article is supported by said means for supporting;

means for clamping said article against said means for supporting during projection; and means for controlling at least one of said means for clamping and said means for supplying a backfill gas to release said article from said means for supporting by use of said backfill gas pressure.

14. A method of supporting an article during a lithographic process, comprising:

supplying a backfill gas to a backside of the article at a backfill gas pressure when the article is supported by an article support structure;

clamping the article against the article support structure during projection of an image onto said article; and controlling at least one of said supplying and said clamping to release said article by use of said backfill gas pressure.

* * * * *